(12) United States Patent
Darolia et al.

(10) Patent No.: US 7,357,958 B2
(45) Date of Patent: Apr. 15, 2008

(54) METHODS FOR DEPOSITING GAMMA-PRIME NICKEL ALUMINIDE COATINGS

(75) Inventors: Ramgopal Darolia, West Chester, OH (US); Brett Allen Rohrer Boutwell, Liberty Township, OH (US); Mark Daniel Gorman, West Chester, OH (US)

(73) Assignee: General Electric Company, Schenectady, NY (US)

( * ) Notice: Subject to any disclaimer, the term of this patent is extended or adjusted under 35 U.S.C. 154(b) by 292 days.

(21) Appl. No.: 10/904,221

(22) Filed: Oct. 29, 2004

(65) Prior Publication Data

US 2006/0093752 A1 May 4, 2006

(51) Int. Cl.
*C23C 16/00* (2006.01)
(52) U.S. Cl. .................. 427/248.1; 427/250
(58) Field of Classification Search ............. None
See application file for complete search history.

(56) References Cited

U.S. PATENT DOCUMENTS

| | | | | |
|---|---|---|---|---|
| 4,758,480 A | * | 7/1988 | Hecht et al. | 428/680 |
| 5,942,337 A | | 8/1999 | Rickerby et al. | |
| 6,511,762 B1 | * | 1/2003 | Lee et al. | 428/697 |
| 6,521,113 B2 | * | 2/2003 | Strangman et al. | 205/191 |
| 2002/0192496 A1 | * | 12/2002 | Grylls et al. | 428/687 |
| 2003/0118448 A1 | * | 6/2003 | Lee et al. | 416/241 R |
| 2003/0118863 A1 | | 6/2003 | Darolia et al. | |
| 2004/0126492 A1 | | 7/2004 | Weaver et al. | |

FOREIGN PATENT DOCUMENTS

GB 2322869 9/1998

OTHER PUBLICATIONS

"Intermetallics" Wikipedia article. http://en.wikipedia.org/wii/Intermetallics. Accessed Oct. 10, 2007.*

* cited by examiner

*Primary Examiner*—Timothy Meeks
*Assistant Examiner*—Kelly M Stouffer
(74) *Attorney, Agent, or Firm*—William Scott Andes; Gary M. Hartman; Domenica N.S. Hartman

(57) ABSTRACT

Methods for depositing an overlay coating on articles intended for use in hostile thermal environments. The coating has a predominantly gamma prime-phase nickel aluminide ($Ni_3Al$) composition suitable for use as an environmental coating and as a bond coat of a thermal barrier coating system. The coating further contains at least one platinum group metal, preferably chromium, optionally one or more reactive elements, and optionally silicon. The coating is deposited by a process that entails forming a platinum group metal layer and at least one separate layer of other constituents of the coating, and then performing a diffusion heat treatment to yield the coating.

20 Claims, 2 Drawing Sheets

I External NiO, Internal $Cr_2O_3/Al_2O_3/Ni(Al,Cr)_2O_4$
II External $Cr_2O_3$, Internal $Al_2O_3$
III External $Al_2O_3$

METHODS FOR DEPOSITING GAMMA-PRIME NICKEL ALUMINIDE COATINGS

BACKGROUND OF THE INVENTION

This invention relates to coatings of the type used to protect components exposed to high temperature environments, such as the hostile thermal environment of a gas turbine engine. More particularly, this invention is directed to methods for depositing predominantly gamma-prime ($\gamma'$) phase nickel aluminide overlay coatings that are alloyed to exhibit enhanced environmental properties, and as a result are useful as environmental coatings and as bond coats for thermal insulating ceramic layers.

Certain components of the turbine, combustor and augmentor sections that are susceptible to damage by oxidation and hot corrosion attack are typically protected by an environmental coating and optionally a thermal barrier coating (TBC), in which case the environmental coating is termed a bond coat that in combination with the TBC forms what may be termed a TBC system. Environmental coatings and TBC bond coats are often formed of an oxidation-resistant aluminum-containing alloy or intermetallic whose aluminum content provides for the slow growth of a strong adherent continuous aluminum oxide layer (alumina scale) at elevated temperatures. This thermally grown oxide (TGO) provides protection from oxidation and hot corrosion, and in the case of a bond coat promotes a chemical bond with the TBC. However, a thermal expansion mismatch exists between metallic bond coats, their alumina scale and the overlying ceramic TBC, and peeling stresses generated by this mismatch gradually increase over time to the point where TBC spallation can occur as a result of cracks that form at the interface between the bond coat and alumina scale or the interface between the alumina scale and TBC. More particularly, coating system performance and life have been determined to be dependent on factors that include stresses arising from the growth of the TGO on the bond coat, stresses due to the thermal expansion mismatch between the ceramic TBC and the metallic bond coat, the fracture resistance of the TGO interface (affected by segregation of impurities, roughness, oxide type and others), and time-dependent and time-independent plastic deformation of the bond coat that leads to rumpling of the bond coat/TGO interface. Therefore, advancements in TBC coating system are concerned with delaying the first instance of oxide spallation affected by the above factors.

Environmental coatings and TBC bond coats in wide use include alloys such as MCrAlX overlay coatings (where M is iron, cobalt and/or nickel, and X is yttrium or another rare earth element), and diffusion coatings that contain aluminum intermetallics, predominantly beta-phase nickel aluminide ($\beta$-NiAl) and platinum aluminides (PtAl). Because TBC life depends not only on the environmental resistance but also the strength of its bond coat, bond coats capable of exhibiting higher strength have also been developed, a notable example of which is beta-phase NiAl overlay coatings. In contrast to the aforementioned MCrAlX overlay coatings, which are metallic solid solutions containing intermetallic phases, the NiAl beta phase is an intermetallic compound that exists for nickel-aluminum compositions containing about 30 to about 60 atomic percent aluminum. Examples of beta-phase NiAl overlay coatings are disclosed in commonly-assigned U.S. Pat. No. 5,975,852 to Nagaraj at al., U.S. Pat. No. 6,153,313 to Rigney at al., U.S. Pat. No. 6,255,001 to Daralia, U.S. Pat. No. 6,291,084 to Darolia et al., and U.S. Pat. No. 6,620,524 to Pfaendtner et al. These NiAl compositions, which preferably contain a reactive element (such as zirconium and/or hafnium) and/or other alloying constituents (such as chromium), have been shown to improve the adhesion of a ceramic TBC, thereby increasing the spallation resistance of the TBC. The presence of reactive elements such as zirconium and hafnium in these beta-phase NiAl overlay coatings has been shown to improve environmental resistance as well as strengthen the coating, primarily by solid solution strengthening. However, beyond the solubility limits of the reactive elements, precipitates of a Heusler phase ($Ni_2AlZr$ (Hf, Ti, Ta)) can occur that can drastically lower the oxidation resistance of the coating.

The suitability of environmental coatings and TBC bond coats formed of NiAlPt to contain the gamma phase ($\gamma$-Ni) and gamma-prime phase ($\gamma'$-$Ni_3Al$) has also been considered. For example, in work performed by Gleeson et al. at Iowa State University, Ni-22Al-30Pt compositions by atomic percent (about Ni-6.4Al-63.5Pt by weight percent) were evaluated, with the conclusion that the addition of platinum to gamma+gamma prime coating alloys is beneficial to their oxidation resistance. It was further concluded that, because nickel-base superalloys typically have a gamma+gamma prime microstructure, there are benefits to coatings that also contain the gamma+gamma prime structure. Finally, Pt-containing gamma+gamma prime coatings modified to further contain reactive elements were also contemplated. Gleeson et al. evaluated the NiAlPt compositions by way of iriterdiffusion couples formed by hot isostatic pressing NiAlPt coupons to nickel or nickel alloy coupons. Accordingly, methods for depositing the NiAlPt compositions in the form of coatings were not evaluated by Gleeson et al.

TBC systems and environmental coatings are being used in an increasing number of turbine applications (e.g., combustors, augmentors, turbine blades, turbine vanes, etc.). Notable substrate materials include directionally-solidified (DS) alloys such as René 142 and single-crystal (SX) alloys such as René N5. The spallation resistance of a TBC is complicated in part by the composition of the underlying superalloy and interdiffusion that occurs between the superalloy and the bond coat. For example, the above-noted bond coat materials contain relatively high amounts of aluminum relative to the superalloys they protect, while superalloys contain various elements that are not present or are present in relatively small amounts in these coatings. During bond coat deposition, a primary diffusion zone of chemical mixing occurs to some degree between the coating and the superalloy substrate as a result of the concentration gradients of the constituents. For many nickel-base superalloys, it is typical to see a primary diffusion zone of topologically close-packed (TCP) phases in the gamma matrix phase of the superalloy after high temperature exposures. The incidence of a moderate amount of TCP phases beneath the coating is typically not detrimental. At elevated temperatures, further interdiffusion occurs as a result of solid-state diffusion across the substrate/coating interface. This additional migration of elements across the substrate-coating interface can sufficiently alter the chemical composition and microstructure of both the bond coat and the substrate in the vicinity of the interface to have deleterious results. For example, migration of aluminum out of the bond coat reduces its oxidation resistance, while the accumulation of aluminum in the substrate beneath the bond coat can result in the formation of a deleterious secondary reaction zone (SRZ) beneath the primary diffusion zone. Certain high strength nickel-base superalloys that contain significant amounts of refractory elements, such as tungsten, tantalum, molybdenum, chromium, and particularly rhenium are prone to the formation of SRZ containing y phase and deleterious TCP phases (typically containing rhenium, tungsten and/or tantalum) in a gamma-prime matrix phase (hence, characterized by a gamma/gamma-prime inversion). Because the boundary between SRZ constituents and the original substrate is a high angle boundary that doesn't tolerate deformation, SRZ and its boundaries readily crack under stress, drastically reducing the load-carrying capability of the alloy. Notable examples of superalloys prone to deleterious SRZ formation include fourth generation single—crystal nickel—base superalloys disclosed in commonly-assigned U.S. Pat. Nos. 5,455,120 and 5,482,789, commercially known as René N6 and MX4, respectively. There have been ongoing efforts to develop coating systems and coating processes that substantially reduce or eliminate the formation of SRZ in high-refractory alloys coated with diffusion aluminide and overlay coatings.

In view of the above, there remains a considerable and continuous effort to develop coating compositions and coating processes capable of yielding environmental coatings and TBC bond coats that exhibit improved service life and a reduced tendency for SRZ formation.

BRIEF SUMMARY OF THE INVENTION

The present invention generally provides methods for depositing protective overlay coatings for articles used in hostile thermal environments, such as turbine, combustor and augmentor components of a gas turbine engine. The invention is particularly directed to depositing a predominantly gamma prime-phase nickel aluminide ($Ni_3Al$) overlay coating suitable for use as an environmental coating and as a bond coat for a thermal barrier coating (TBC). The gamma prime-phase nickel aluminide employed in the present invention is one of two stable intermetallic compounds of nickel and aluminum. The gamma prime-phase exists for NiAl compositions containing nickel and aluminum in an atomic ratio of about 3:1, while beta-phase nickel aluminide (NiAl) exists for NiAl compositions containing nickel and aluminum in an atomic ratio of about 1:1. Gamma prime-phase nickel aluminide has a nominal composition of, by weight, about 86.7% nickel and about 13.3% aluminum, in contrast to the beta phase with a nominal composition of, by weight, about 68.5% nickel and about 31.5% aluminum. Accordingly, the gamma prime-phase nickel aluminide overlay coatings of this invention are compositionally distinguishable from beta-phase NiAl overlay coatings, as well as diffusion aluminide coatings that are predominantly beta-phase NiAl.

According to a preferred aspect of the invention, the overlay coating is deposited for use in a coating system on a superalloy substrate. The overlay coating contains nickel aluminide intermetallic predominantly of the gamma prime phase, and has a composition of, by weight, at least 6% to about 15% aluminum, at least one platinum group metal in an amount up to 60%, preferably about 2% to about 5% chromium, optionally one or more reactive elements in individual or combined amounts of up to 4%, optionally up to 2% silicon, and the balance essentially nickel. A thermal-insulating ceramic layer may be deposited on the overlay coating so as to be adhered to the substrate with the overlay coating.

The gamma-prime-phase nickel aluminide overlay coating is deposited on the substrate by a process that entails forming a platinum group metal layer and at least one separate layer of other constituents of the coating system, and then performing a diffusion heat treatment to yield the overlay coating. In combination with the gamma prime-phase nickel aluminide intermetallic overlay coating, the deposition methods of this invention is believed to have a number of advantages over existing overlay and diffusion coatings used as environmental coatings and bond coats for TBC. The composition of the overlay coating is more chemically similar to superalloy compositions on which the overlay coating is deposited, especially in terms of aluminum content. When deposited in accordance with the invention, there is a reduced tendency for aluminum (and other coating constituents) to diffuse from the overlay coating into a nickel-base superalloy substrate, thereby reducing the likelihood that deleterious SRZ will form in the superalloy. The gamma-prime phase ($Ni_3Al$) is also intrinsically stronger than the beta phase (NiAl), enabling the overlay coatings of this invention to better inhibit spallation events brought on by stress-related factors.

Other objects and advantages of this invention will be better appreciated from the following detailed description.

DETAILED DESCRIPTION OF THE INVENTION

Figure 1:
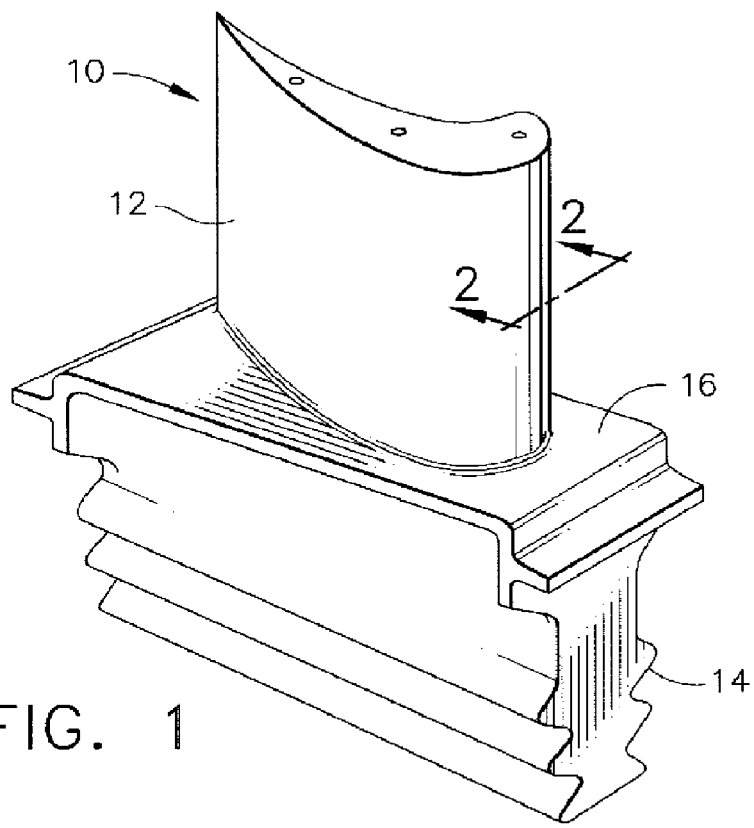
FIG. 1 is a perspective view of a high pressure turbine blade.

The present invention is generally applicable to components that operate within environments characterized by relatively high temperatures, and are therefore subjected to severe thermal stresses and thermal cycling. Notable examples of such components include the high and low pressure turbine nozzles and blades, shrouds, combustor liners and augmentor hardware of gas turbine engines. One such example is the high pressure turbine blade 10 shown in FIG. 1. The blade 10 generally includes an airfoil 12 against which hot combustion gases are directed during operation of the gas turbine engine, and whose surface is therefore subjected to severe attack by oxidation, corrosion and erosion. The airfoil 12 is anchored to a turbine disk (not shown) with a dovetail 14 formed on a root section 16 of the blade 10. While the advantages of this invention will be described with reference to the high pressure turbine blade 10 shown in FIG. 1, the teachings of this invention are generally applicable to any component on which a coating system may be used to protect the component from its environment.

Figure 2:
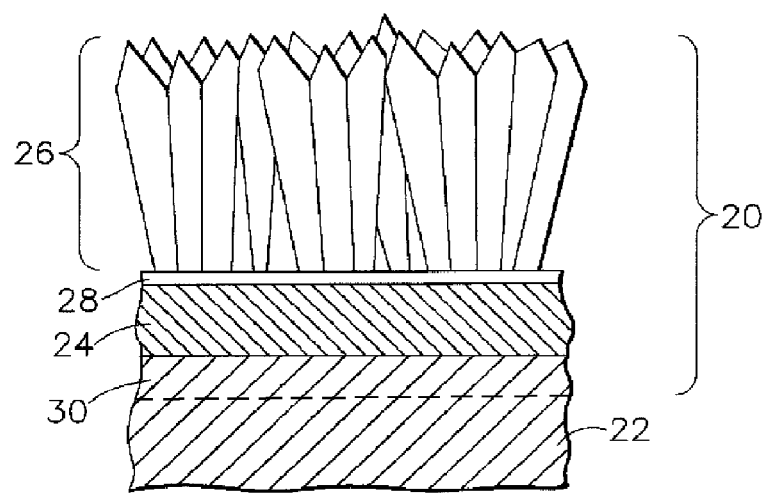
FIG. 2 is a cross-sectional view of the blade of FIG. 1 along line 2-2 and shows a thermal barrier coating system on the blade, including a gamma prime-phase nickel aluminide intermetallic overlay coating deposited in accordance with an embodiment of this invention.

Represented in FIG. 2 is a TBC system 20 of a type that benefits from the teachings of this invention. As shown, the coating system 20 includes a ceramic layer (TBC) 26 bonded to the blade substrate 22 with an overlay coating 24, which therefore serves as a bond coat to the TBC 26. The substrate 22 (blade 10) is a high-temperature material, preferably a nickel-base superalloy. As indicated in FIG. 2 and previously discussed, a primary diffusion zone 30 of chemical mixing is present to some degree between the overlay coating 24 and the superalloy substrate 22.

To attain the strain-tolerant columnar grain structure depicted in FIG. 2, the TBC 26 is preferably deposited by physical vapor deposition (PVD), though other deposition techniques could be used including thermal spray processes. A preferred material for the TBC 26 is an yttria-stabilized zirconia (YSZ), with a suitable composition being about 3 to about 20 weight percent yttria (3-20% YSZ), though other ceramic materials could be used, such as yttria, nonstabilized zirconia, and zirconia stabilized by other oxides. Notable alternative materials for the TBC 26 include those formulated to have lower coefficients of thermal conductivity (low-k) than 7% YSZ, notable examples of which are disclosed in commonly-assigned U.S. Pat. No. 6,586,115 to Rigney et al., U.S. Pat. No. 6,686,060 to Bruce et al., commonly-assigned U.S. patent application Ser. Nos. 10/063,962 to Bruce, 10/064,785 to Darolia et al., and 10/064,939 to Bruce et al., and U.S. Pat. No. 6,025,078 to Rickerby. Still other suitable ceramic materials for the TBC 26 include those that resist spallation from contamination by compounds such as CMAS (a eutectic of calcia, magnesia, alumina and silica). For example, the TBC can be formed of a material capable of interacting with molten CMAS to form a compound with a melting temperature that is significantly higher than CMAS, so that the reaction product of CMAS and the material does not melt and infiltrate the TBC. Examples of CMAS-resistant coatings include alumina, alumina-containing YSZ, and hafnia-based ceramics disclosed in commonly-assigned U.S. Pat. Nos. 5,660,885, 5,683,825, 5,871,820, 5,914,189, and 6,627,323 and commonly-assigned U.S. patent application Ser. Nos. 10/064,939 and 10/073,564, whose disclosures regarding CMAS-resistant coating materials are incorporated herein by reference. Other potential ceramic materials for the TBC include those formulated to have erosion and/or impact resistance better than 7% YSZ. Examples of such materials include certain of the above-noted CMAS-resistant materials, particularly alumina as reported in U.S. Pat. No. 5,683,825 and U.S. patent application Ser. No. 10/073,564. Other erosion and impact-resistant compositions include reduced-porosity YSZ as disclosed in commonly-assigned U.S. patent application Ser. Nos. 10/707,197 and 10/708,020, fully stabilized zirconia (e.g., more than 17% YSZ) as disclosed in commonly-assigned U.S. patent application Ser. No. 10/708,020, and chemically-modified zirconia-based ceramics. The TBC 26 is deposited to a thickness that is sufficient to provide the required thermal protection for the underlying substrate 22 and blade 10, generally on the order of about 100 to about 300 micrometers.

As with prior art TBC systems, the surface of the overlay coating 24 has a composition that when exposed to an oxidizing environment forms an aluminum oxide surface layer (alumina scale) 28 to which the TBC 26 chemically bonds. According to the invention, the overlay coating 24 is predominantly of gamma-prime phase nickel aluminide ($Ni_3Al$), preferably with limited alloying additions. Depending on its composition, the overlay coating 24 can be deposited using a single deposition process or a combination of processes, as discussed in further detail below. An adequate thickness for the overlay coating 24 is about fifty micrometers in order to protect the underlying substrate 22 and provide an adequate supply of aluminum for formation of the alumina scale 28, though thicknesses of about twelve to about one hundred micrometers are believed to be suitable.

To be predominantly of the gamma-prime intermetallic phase, the overlay coating 24 of this invention preferably contains nickel and aluminum in an atomic ratio of about 3 to 1, which on a weight basis is about 86.7 to 13.3. An aluminum content upper limit of about 15 weight percent is generally necessary to stay within the gamma-prime field. With further alloying additions, the aluminum content of the overlay coating 24 may be as low as about 6 weight percent, which is believed to be sufficient to form the desired alumina scale 28. A preferred aluminum content is in the range of about 8.5 to about 15 weight percent. The coating 24 also contains a platinum group metal, such as platinum, rhodium, palladium, and iridium. Platinum and other platinum group metals are known to have a beneficial effect with conventional diffusion aluminide coatings. When added to the predominantly gamma-prime phase of the overlay coating 24 of this invention, platinum group metals have been shown to improve oxidation resistance by enhancing the ability of the coating 24 to form an adherent alumina scale. Excellent oxidation resistance measured by weight gains and the rate constants (kp) have also been achieved with certain Ni—Al—Pt intermetallic compositions. A platinum group metal content of up to about 60 weight percent is believed to be beneficial for the gamma-prime phase overlay coating 24. A platinum group metal content of about 10 weight percent is believed necessary to provide any notable benefit to the coating 24.

Figure 3:
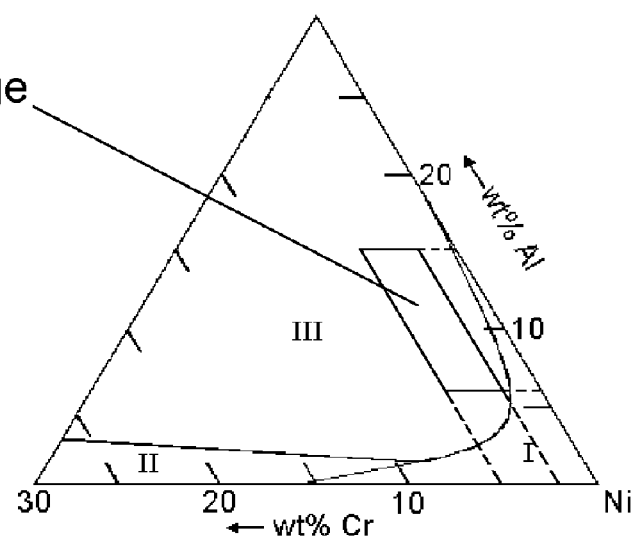
FIG. 3 is a chart indicating suitable compositional ranges for nickel, aluminum and chromium in a gamma prime-phase nickel aluminide intermetallic composition useful as the overlay coating of FIG. 2.

According to a preferred aspect of the invention, the coating 24 also contains chromium, optionally one or more reactive elements such as zirconium, hafnium, yttrium, tantalum, etc., and optionally silicon. A suitable chromium content is about 2 to 5 weight percent chromium. Chromium is a preferred additive as it promotes the corrosion resistance of the overlay coating 24 as well as helps in the formation of the alumina scale 28, especially when the aluminum content of the coating 24 is near the lower end of the above-noted range for aluminum. This preferred relationship between the aluminum and chromium content is depicted in FIG. 3, and discussed in commonly-assigned U.S. Pat. No. 7,264,888, filed concurrently herewith. Chromium contents above about 5 weight percent are believed to be detrimental. For example, higher chromium contents refine the alumina grain size leading to higher oxidation rates, and promote the formation of non-protective $Cr_2O_3$ scale as opposed to the desired alumina scale 28. Higher chromium contents also risk the formation of volatile chromium trioxide ($CrO_3$), and may reduce the formability of the gamma-prime phase compositions. This aspect is important in the manufacture of ingots that would be used as a source material if depositing the coating 24 using a PVD process from a single deposition source, as discussed below.

As indicated above, the coating 24 optionally contains one or more reactive elements such as zirconium, hafnium, yttrium, tantalum, etc. The presence of one or more of these reactive elements in the coating 24 in a combined amount of at least 0.5 weight percent is preferred for promoting the oxidation or environmental resistance and strength of the gamma-prime phase. A combined or individual reactive element content of above about 4 weight percent is believed to be detrimental due to the solubility limits of the individual elements in the gamma-prime phase and the adverse effect that these elements have on ductility of the gamma-prime phase beyond this level.

Limited additions of silicon are believed to have a strong beneficial effect on oxidation resistance in gamma-prime phase compositions. However, silicon must be controlled to not more than about 2 weight percent to avoid excessive interdiffusion into the substrate 22.

On the basis of the above, the nickel content may be as high as about 80 weight percent (i.e., when the coating contains the minimum amounts of aluminum, chromium, and platinum group metal) to ensure that the coating 24 is predominantly of the gamma-prime phase. On the other hand, nickel contents of as low as about 20 weight percent may exist if the coating 24 contains a maximum combined amount of aluminum, chromium, platinum group metal, reactive element(s), and silicon contemplated for the coating 24. Because of interdiffusion inherent in any process of forming the coating 24, the coating 24 will contain up to about 8 weight percent of elements such as tungsten, rhenium, tantalum, molybdenum, etc., that were not deposited with the intentional coating constituents but have diffused into the coating 24 from the substrate 22.

The present invention generally encompasses two approaches for incorporating platinum group metal into the predominantly gamma-prime phase of the overlay coating 24. In each case, the platinum group metal is deposited separately from the remaining constituents of the coating 24. A first approach is to electroplate the one or more platinum group metals on a nickel-base superalloy substrate to a thickness required to obtain the desired platinum group metal level in the coating 24. A chromium-containing nickel aluminide composition (optionally further containing one or more reactive elements and/or silicon) is then deposited on the platinum group metal layer by PVD to obtain the desired predominantly gamma-prime phase coating 24. Alternatively, the nickel aluminide composition can be deposited first, followed by the layer of platinum group metal. Another alternative is to deposit nickel, aluminum, and chromium (and any reactive elements and/or silicon) separately. Thereafter, a diffusion heat treatment is performed to yield a homogeneous NiAlPt-containing intermetallic coating of predominantly the gamma-prime phase. A suitable heat treatment is believed to entail temperatures in a range of about 1800° F. to about 2000° F. (about 980° C. to about 1090° C.) held for about two to about sixteen hours in a vacuum or an inert atmosphere such as argon. A preferred PVD process for use in this approach is ion plasma deposition (IPD), though electron beam physical vapor deposition (EBPVD) or sputtering could also be used. Using IPD or EBPVD, the desired coating constituents (other than the platinum group metal) can be contained in a single cathode (IPD) or ingot (EBPVD), or provided by separate cathodes or ingots. While deposition by PVD is preferred, it is foreseeable that other techniques, such as thermal spraying of powders, could be used to deposit the nickel, aluminum, chromium, and optional reactive element and/or silicon constituents of the coating.

While the invention has been described in terms of a preferred embodiment, it is apparent that other forms could be adopted by one skilled in the art. Accordingly, the scope of the invention is to be limited only by the following claims.

What is claimed is:

1. A process of depositing a coating system on a nickel-base superalloy substrate, the process comprising the steps of:
    forming on a surface of the substrate a platinum group metal layer and at least one separate layer, the platinum group metal layer containing at least one platinum group metal and the at least one separate layer containing aluminum, optionally nickel, optionally chromium, optionally silicon, and optionally one or more reactive elements; and then
    diffusion heat treating the platinum group metal layer and the at least one separate layer to form a homogeneous overlay coating on the surface of the substrate, the overlay coating consisting essentially of nickel aluminide intermetallic, the at least one platinum group metal, one or more elements that diffused into the overlay coating from the substrate, optionally chromium, optionally silicon, and optionally the one or more reactive elements, the nickel aluminide intermetallic being predominantly gamma prime phase.

2. The process according to claim 1, wherein the overlay coating contains, by weight, at least 6% to about 15% aluminum, and at least 10% up to about 60% of the at least one platinum group metal.

3. The process according to claim 1, wherein the overlay coating consists of nickel, aluminum, chromium, the at least one platinum group metal, and the one or more elements that diffused into the overlay coating from the substrate.

4. The process according to claim 1, wherein the overlay coating contains chromium.

5. The process according to claim 4, wherein the overlay coating contains, by weight, about 2% to about 5% chromium.

6. The process according to claim 1, wherein the overlay coating contains the one or more reactive elements in an amount of, by weight, up to 4%.

7. The process according to claim 6, wherein the overlay coating contains at least one of zirconium, hafnium, yttrium, and tantalum as the one or more reactive elements.

8. The process according to claim 1, wherein the overlay coating contains silicon in amount of, by weight, up to 2%.

9. The process according to claim 1, wherein the platinum group metal layer is formed by electroplating the at least one platinum group metal.

10. The process according to claim 1, wherein the platinum group metal layer is formed by electroplating the at least one platinum group metal on the surface of the substrate.

11. The process according to claim 1, wherein the at least one separate layer comprises a layer of the nickel aluminide intermetallic formed by a physical vapor deposition technique, and the diffusion heat treating step entails diffusing the layer of the nickel aluminide intermetallic into the platinum group metal layer to form the overlay coating.

12. The process according to claim 11, wherein the physical vapor deposition technique is ion plasma deposition.

13. The process according to claim 1, wherein the aluminum content of the overlay coating is not co-deposited with the nickel content of the overlay coating.

14. The process according to claim 13, wherein the aluminum content and the nickel content of the overlay coating are separately deposited by physical vapor deposition, and the diffusion heat treating step entails diffusing the aluminum content and the nickel content of the overlay coating into the platinum group metal layer to form the overlay coating and the nickel aluminide intermetallic thereof.

15. The process according to claim 13, wherein the aluminum content of the overlay coating is deposited on the platinum group metal layer by a low-activity diffusion aluminiding process carried out at a temperature of as low as about 700° C. to form the at least one separate layer and the nickel content of the overlay coating simultaneously diffuses into the platinum group metal layer from the substrate, and the diffusion heat treating step entails diffusing the at least one separate layer into the platinum group metal layer to form the overlay coating and the nickel aluminide intermetallic thereof.

16. The process according to claim 13, wherein the aluminum content of the overlay coating is deposited by a low-activity diffusion aluminiding process to form the at least one separate layer and simultaneously diffuse nickel from the substrate into the at least one separate layer, the platinum group metal layer is deposited after the low-activity diffusion aluminiding process, and the diffusion heat treating step entails diffusing the platinum group metal layer into the at least one separate layer to form the overlay coating and the nickel aluminide intermetallic thereof.

17. The process according to claim 1, further comprising the step of depositing a thermal-insulating ceramic layer on the overlay coating.

18. The process according to claim 1, wherein the overlay coating contains nickel and aluminum in an atomic ratio of about 3:1.

19. The process according to claim 1, wherein the superalloy substrate contains at least one refractory metal selected from the group consisting of about tantalum, tungsten, molybdenum, rhenium, and hafnium.

20. A process of depositing a coating system on a nickel-base superalloy substrate that contains at least one refractory metal selected from the group consisting of tantalum, tungsten, molybdenum, rhenium, and hafnium, the process comprising the steps of:

forming on a surface of the substrate a platinum group metal layer of at least one platinum group metal by electroplating and at least one separate layer containing nickel, aluminum, chromium, optionally silicon, and optionally one or more reactive elements by physical vapor deposition; and then diffusion heat treating the platinum group metal layer and the at least one separate aver to form a homogeneous overlay coating on the surface of the substrate, the overlay coating consisting essentially of nickel aluminide intermetallic, about 2 to about 5 weight percent chromium, at least 10 up to about 60 weight percent of the at least one platinum aroun metal, one or more elements that diffused into the overlay coating from the substrate, optionally up to 2 weight percent silicon, and optionally up to 4 weight percent of the one or more reactive elements, the nickel aluminide intermetallic being predominantly gamma prime phase and the aluminum content thereof constituting at least 6 to about 15 weight percent of the overlay coating.

* * * * *